United States Patent
Choi et al.

(10) Patent No.: US 9,172,356 B2
(45) Date of Patent: Oct. 27, 2015

(54) HIGH SIDE GATE DRIVER, SWITCHING CHIP, AND POWER DEVICE

(71) Applicant: Samsung Electronics Co., Ltd., Suwon-Si, Gyeonggi-Do (KR)

(72) Inventors: Hyun-sik Choi, Hwaseong-si (KR); Ho-jung Kim, Suwon-si (KR); Jai-kwang Shin, Anyang-si (KR); U-in Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 13/688,484

(22) Filed: Nov. 29, 2012

(65) Prior Publication Data

US 2013/0265028 A1    Oct. 10, 2013

(30) Foreign Application Priority Data

Apr. 5, 2012    (KR) .................. 10-2012-0035598

(51) Int. Cl.
*H03B 1/00* (2006.01)
*H03K 3/00* (2006.01)
*G05F 3/02* (2006.01)
*H03K 17/06* (2006.01)

(52) U.S. Cl.
CPC .. *H03K 3/00* (2013.01); *G05F 3/02* (2013.01); *H03K 17/06* (2013.01); *H01L 2924/0002* (2013.01)

(58) Field of Classification Search
CPC ........... H03K 19/00361; H04L 25/028; H01K 17/06; H01L 2924/0002; G05F 3/02
USPC .......... 323/311, 289, 361, 312; 327/108, 109, 327/381, 538–543
See application file for complete search history.

(56) References Cited

U.S. PATENT DOCUMENTS

| 6,538,279 | B1 | 3/2003 | Blanchard |
| 7,432,756 | B2 | 10/2008 | Boe |
| 7,626,429 | B2* | 12/2009 | Wu et al. ........................ 327/112 |
| 8,018,255 | B2* | 9/2011 | Hirao et al. .................... 327/108 |
| 8,063,616 | B2* | 11/2011 | Bahramian et al. ........... 323/271 |
| 8,390,337 | B2* | 3/2013 | Shumkov et al. .............. 327/108 |
| 8,547,142 | B2* | 10/2013 | Nakahara et al. .............. 327/108 |
| 2003/0231046 | A1 | 12/2003 | Giacomini et al. |
| 2006/0034107 | A1 | 2/2006 | West |
| 2006/0267641 | A1* | 11/2006 | Khan et al. ..................... 327/108 |
| 2010/0264958 | A1* | 10/2010 | Nakamura et al. ............ 327/109 |
| 2011/0121884 | A1 | 5/2011 | Mazzola et al. |

* cited by examiner

*Primary Examiner* — Gary L Laxton
*Assistant Examiner* — Kevin H Sprenger
(74) *Attorney, Agent, or Firm* — Harness, Dickey & Pierce, P.L.C.

(57) ABSTRACT

A high side gate driver, a switching chip, and a power device, which respectively include a protection device, are provided. The high side gate driver includes a first terminal configured to receive a first low level driving power supply that is provided to turn off the high side normally-on switch; a first switching device connected to the first terminal; and a protection device connected in series between the first switching device and a gate of the high side normally-on switch, the protection device configured to absorb a majority of a voltage applied to a gate of the high side normally-on switch. The power device includes the high side gate driver. In addition, the switching chip includes a high side normally-on switch, an additional normally-on switch, and a low side normally-on switch, which have a same structure.

20 Claims, 10 Drawing Sheets

HIGH SIDE GATE DRIVER, SWITCHING CHIP, AND POWER DEVICE

CROSS-REFERENCE TO RELATED APPLICATIONS

This application claims the benefit of Korean Patent Application No. 10-2012-0035598, filed on Apr. 5, 2012, in the Korean Intellectual Property Office, the disclosure of which is incorporated herein in its entirety by reference.

BACKGROUND

1. Field

The present disclosure relates to high side gate drivers, switching chips, and power devices, and more particularly, to a high side gate driver, a switching chip, and a power device, which respectively include a protection device.

2. Description of the Related Art

Recently, electronic apparatuses have started to include power devices that receive a main power supply voltage and convert the main power supply voltage into a voltage for each device and/or distribute the main power supply voltage to each device. Such power devices may be manufactured by using a silicon-based semiconductor or may be implemented by using a gallium nitride (GaN) transistor or a silicon carbide (SiC) transistor based on a compound semiconductor such as GaN, SiC, or the like.

A normally-on switch, is a push-to-break switch which returns to its normally closed (on) position when released. In a high side gate driver, a relatively high level voltage is applied to an output terminal of the high side gate driver. Thus, in order to turn on or off a high side normally-on switch, a relatively high level voltage corresponding to a voltage of the output terminal has to be applied to a gate of the high side normally-on switch. Such high level voltage may cause breakdown of surrounding switching devices.

SUMMARY

Provided are high side gate drivers, switching chips, and power devices, which are capable of preventing breakdown phenomena of surrounding switching devices.

Additional aspects will be set forth in part in the description which follows and, in part, will be apparent from the description, or may be learned by practice of the presented embodiments.

According to an example embodiment, a high side gate driver configured to control a high side normally-on switch includes a first switching device configured to receive a first low level driving power supply and a protection device connected in series between the first switching device and a gate of the high side normally-on switch, the protection device configured to reduce a voltage that is applied to the first switching device.

A resistance value of the protection device may be 50 times through about 100 times the resistance value of the first switching device. The protection device may include an additional normally-on switch. In this case, a plane area of the additional normally-on switch may be one-tenth to one hundredth of the plane area of the high side normally-on switch.

The additional normally-on switch may include a gate configured to receive a voltage applied thereto that is larger than a threshold voltage of the additional normally-on switch. For example, the gate of the additional normally-on switch may be connected to a ground terminal.

The gate of the additional normally-on switch may be connected to a source/drain of the additional normally-on switch.

The additional normally-on switch and the high side normally-on switch may have a same structure. The same structure may include one selected from among a gallium nitride (GaN) transistor, a silicon carbide (SiC) transistor, and an insulated gate bipolar transistor.

The high side gate driver may further include a second switching device connected between the protection device and a second low level driving power supply, wherein a voltage of the second low level driving power supply may be larger than a voltage of the first low level driving power supply.

The first switching device may be configured to turn on after the second switching device is turned on, if the high side normally-on switch is turned According to another example embodiment, a power device includes: a high side normally-on switch having a source connected to an output terminal, a drain connected to a high level power supply, and a gate, the high side normally-on switch configured to turn off in response to a first low level driving signal; and a high side gate driver configured to control the high side normally-on switch. The high side gate driver includes a first switching device configured to receive a first low level driving power supply, and a protection device connected in series between the first switching device and the gate of the high side normally-on switch, the protection device configured to reduce a voltage that is applied to the first switching device.

The high side gate driver may further include an additional switching device connected between a high level driving power supply and the gate of the high side normally-on switch, the additional switching device configured to selectively provide a first high level driving signal to the high side normally-on switch to turn on the high side normally-on switch.

The high side gate driver may further include a capacitive device connected between the high level driving power supply and the source of the high side normally-on switch.

The power device may further include: a low side normally-on switch, the low side normally-on switch having a source connected to a low level power supply, a drain connected to the output terminal, and a gate; and a low side gate driver configured to controlling the low side normally-on switch.

According to another example embodiment, a power device includes a high side normally-on switch having a source connected to an output terminal, a drain connected to a high level power supply, and a gate configured to switch on the high side normally-on switch in response to a signal provided by a high level driving power supply and switch off the high side normally-on switch in response to a signal provided by a first low level driving power supply; a first switching device configured to receive the first low level driving power supply; and an additional normally-on switch connected to the gate of the high side normally-on switch, the additional normally-on switch configured to reduce a voltage that is applied to the first switching device.

The power device may further include: a second switching device connected between a second low level input terminal and the additional normally-on switch, wherein a voltage of the second low level driving signal is larger than a voltage of the first low level driving signal.

According to another example embodiment, a switching chip includes: a high side normally-on switch including a source connected to an output terminal, a drain connected to a high level power supply, and a gate; an additional normally-on switch connected to the gate of the high side normally-on switch; and a low side normally-on switch including a source connected to a low level power supply, a drain connected to the output terminal, and a gate, wherein the high side normally-on switch, the additional normally-on switch, and the low side normally-on switch have a same structure.

A plane area of the additional normally-on switch may be one-tenth to one hundredth of the plane area of the high side normally-on switch.

A high side gate driver according to an example embodiment and a power device including the high side gate driver include an additional protection device (for example, a normally-on switch) connected to a gate of a high side normally-on switch. Thus, a relatively high level voltage applied to the gate of the high side normally-on switch may be applied mostly to the protection device, and thus, breakdown that may occur as a relatively high level voltage is applied to surrounding switching devices may be prevented.

In the high side gate driver and the power device including the high side gate driver, an additional normally-on switch implemented by using the same structure as the high side normally-on switch is formed as a protection device. Thus, the high side normally-on switch, a low side normally-on switch, and the additional normally-on switch may be implemented by performing the same process, and the protection device may be implemented without an additional process. Furthermore, since only a small area (for example, one-tenth through one hundredth of a plane area of the high side normally-on switch HS) is necessary to implement the additional normally-on switch, a large increase of an area of a switching chip is not required.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
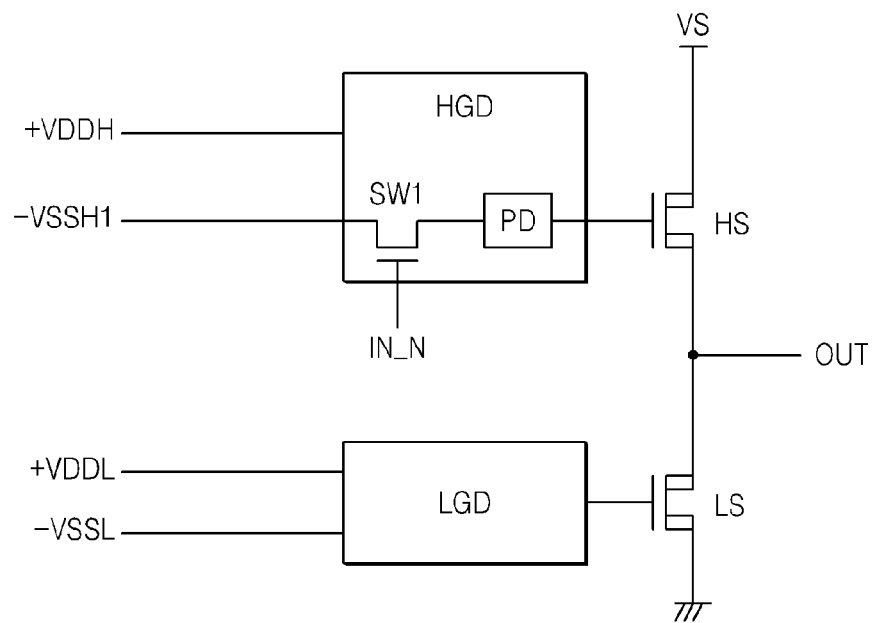
FIG. 1 is a block diagram schematically illustrating a power device according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Terms used in the embodiments set forth herein may have meanings that have been commonly known in the art. For example, at least one may mean one or more, or one or a plurality of numbers.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram schematically illustrating a power device according to an example embodiment.

Referring to FIG. 1, the power device may include a low side normally-on switch LS, a low side gate driver LGD, a high side normally-on switch HS, and a high side gate driver HGD.

The low side normally-on switch LS may include a source connected to a low level power supply (for example, the ground), a drain connected to an output terminal OUT, and a gate connected to the low side gate driver LGD. When the low side normally-on switch LS is turned on, a voltage of the output terminal OUT may be decreased to a voltage (for example, 0 volt (V)) of the low level power supply.

The low side gate driver LGD may be configured to control the low side normally-on switch LS. In more detail, the low side gate driver LGD may be configured to turn on or turn off the low side normally-on switch LS by receiving voltages (for example, pulse voltages) from a high level driving power supply +VDDL and a low level driving power supply −VSSL.

The high side normally-on switch HS may include a source connected to the output terminal OUT, a drain connected to a high level power supply Vs, and a gate connected to the high side gate driver HGD. When the high side normally-on switch HS is turned on, the voltage of the output terminal OUT may be increased to a voltage of the high level power supply Vs.

The high side gate driver HGD may be configured to control the high side normally-on switch HS. In more detail, the high side gate driver HGD may include a high level driving power supply +VDDH, a first low level driving power supply −VSSH1, a protection device PD, and a first switching device SW1.

The high level driving power supply +VDDH may be provided to turn on the high side normally-on switch HS. In more detail, the high side gate driver HGD may be configured to turn on the high side normally-on switch HS by receiving a relatively high level voltage from the high level driving power supply +VDDH. A configuration for turning on the high side normally-on switch HS will be described in detail with reference to FIG. 6 below.

The first low level driving power supply −VSSH1 may be provided to turn off the high side normally-on switch HS. In more detail, the high side gate driver HGD may be configured to turn off the high side normally-on switch HS by receiving a relatively low voltage from the first low level driving power supply −VSSH1.

The protection device PD and the first switching device SW1 may be connected in series between the first low level driving power supply −VSSH1 and the gate of the high side normally-on switch HS. In more detail, the protection device PD may be connected to the high side normally-on switch HS, and the first switching device SW1 may be connected between the first low level driving power supply −VSSH1 and the protection device PD.

In order for a normally-on switch such as a depletion-type transistor to be fully turned off, a negative voltage has to be applied to a gate of the normally-on switch. The high side gate driver HGD may receive a negative voltage from the first low level driving power supply −VSSH1 and then transmit the negative voltage to the high side normally-on switch HS, and thus, the high side normally-on switch HS may fully turned off. In order to control the transmission of the negative voltage, the first switching device SW1 may be connected between the gate of the high side normally-on switch HS and the first low level driving power supply −VSSH1. The first switching device SW1 may be turned on by receiving a signal IN_N, and thus, a voltage (that is, the negative voltage) of the first low level driving power supply −VSSH1 may be applied to the gate of the high side normally-on switch HS.

Before the high side normally-on switch HS is turned off, the output terminal OUT is in a state where a relatively high level voltage (for example, a voltage more than 400 V) is applied thereto. Accordingly, the gate of the high side normally-on switch HS is also in a state where a relatively high level voltage corresponding to the voltage of the output terminal OUT is applied thereto. In this case, when turning on the first switching device SW1 to turn off the high side normally-on switch HS, a breakdown phenomenon of the first switching device SW1 may occur due to the relatively high level voltage applied to the gate of the high side normally-on switch HS.

The high side gate driver HGD and the power device including the high side gate driver HGD may include the protection device PD connected between the first switching device SW1 and the gate of the high side normally-on switch HS. A resistance value of the protection device PD may be about 50 times through about 100 times larger than that of the first switching device SW1. Thus, the relatively high level voltage applied to the gate of the high side normally-on switch HS may be applied mostly to the protection device PD connected to the first switching device SW1 in series, and thus, preventing a breakdown phenomenon that may occur if a relatively high level voltage is applied to the first switching device SW1.

The protection device PD may be implemented by using a structure having a relatively high resistance, for example, may be implemented by using a normally-on switch having a relatively high resistance value. Examples in which the protection device PD is implemented by using a normally-on switch are illustrated in FIGS. 2 and 3.

Figure 2:
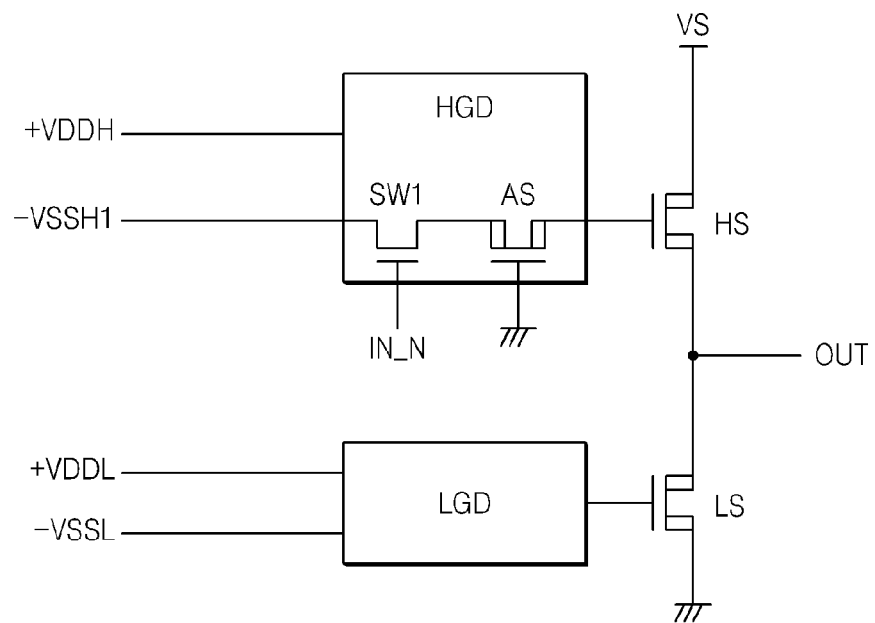
FIGS. 2 and 3 are block diagrams schematically illustrating power devices according to other example embodiments.
Figure 3:
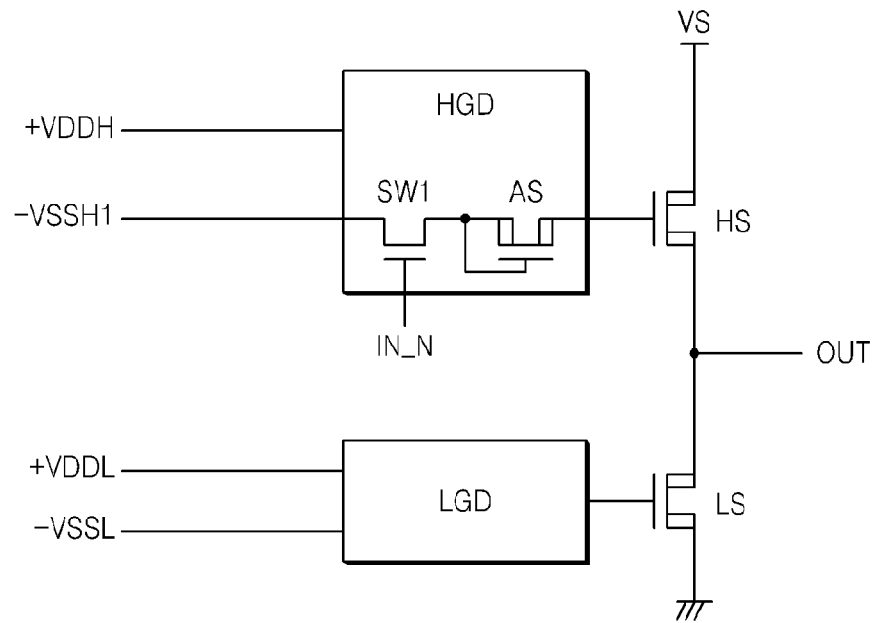

FIGS. 2 and 3 are block diagrams schematically illustrating power devices according to other example embodiments.

Referring to FIGS. 2 and 3, the power device of FIG. 2 and the power device of FIG. 3 may include a low side normally-on switch LS, a low side gate driver LGD, a high side normally-on switch HS, and a high side gate driver HGD. Descriptions for these elements are the same as that stated with reference to FIG. 1, and thus will be omitted below.

The protection device PD of FIG. 3 may include an additional normally-on switch AS as compared to the PD illustrated in FIG. 1. The additional normally-on switch AS may be connected between a first switching device SW1 and the high side normally-on switch HS. A voltage larger than a threshold voltage of the additional normally-on switch AS may be applied to a gate of the additional normally-on switch AS. For example, the threshold voltage of the additional normally-on switch AS may be −5 V. In this case, as illustrated in FIG. 2, the gate of the additional normally-on switch AS may be connected to a ground terminal.

Alternatively, illustrated in FIG. 3, the gate of the additional normally-on switch AS may be connected to a source/drain of the additional normally-on switch AS. In more detail, as illustrated in FIG. 3, the gate of the additional normally-on switch AS may be connected to a source/drain (that is, a source/drain located in the direction of a first low level driving power supply −VSSH1) connected to a drain of the first switching device SW1 from among source/drain terminals of the additional normally-on switch AS. In this case, the additional normally-on switch AS may function as a diode device having a high resistance value.

The additional normally-on switch AS illustrated in FIGS. 2 and 3 may be implemented by using the same structure as the high side normally-on switch HS and/or the low side normally-on switch LS. The same structure may include one selected from among a gallium nitride (GaN) transistor, a silicon carbide (SiC) transistor, and an insulated gate bipolar transistor. In this case, the additional normally-on switch AS may be formed while performing a process of forming the high side normally-on switch HS and/or the low side normally-on switch LS.

The high side gate driver HGD and the power device including the high side gate driver HGD may include the additional normally-on switch AS connected between the first switching device SW1 and the first low level driving power supply −VSSH1. The additional normally-on switch AS may be formed while forming the high side normally-on switch HS and/or the low side normally-on switch LS. Thus, the protection device PD may be implemented without an additional process.

The additional normally-on switch AS may have a small area compared to the high side normally-on switch HS and/or the low side normally-on switch LS. For example, a plane area of the additional normally-on switch AS may be one-tenth through one hundredth of that of the high side normally-on switch HS. Thus, the protection device PD may be implemented without occupying a large area of a semiconductor chip.

Figure 4:
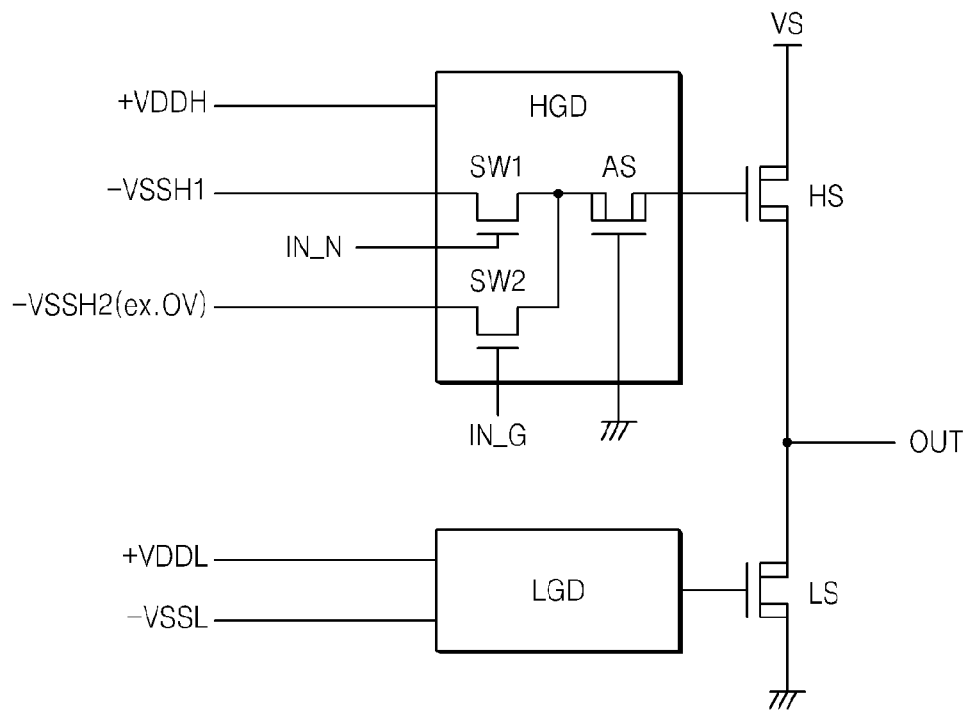
FIG. 4 is a block diagram schematically illustrating a power device according to another example embodiment.

FIG. 4 is a block diagram schematically illustrating a power device according to another example embodiment. The power device of FIG. 4 may be obtained by modifying the power device according to the embodiment of FIG. 2. Thus, descriptions of the same elements will be omitted.

Referring to FIG. 4, the high side gate driver HGD may further include a second low level driving power supply −VSSH2 and a second switching device SW2. The second low level driving power supply −VSSH2 may be provided to decrease a voltage of a gate of a high side normally-on switch HS. In more detail, the high side gate driver HGD may be configured to decrease the voltage of the gate of the high side normally-on switch HS by receiving a voltage (for example, 0 V) higher than that of the first low level driving power supply −VSSH1 from the second low level driving power supply −VSSH2.

The second switching device SW2 may be connected between the second low level driving power supply −VSSH2 and a protection device (for example, the additional normally-on switch AS). The second switching device SW2 may be turned on by receiving a signal IN_G, and thus, a voltage (for example, 0 V) of the second low level driving power supply −VSSH2 may be applied to the gate of the high side normally-on switch HS.

In order to turn off the high side normally-on switch HS, the first switching device SW1 may be configured to be turned off after the second switching device SW2 is turned on. In more detail, the second switching device SW2 may be turned on first to turn off the high side normally-on switch HS. As the second switching device SW2 connected to the second low level driving power supply −VSSH2 is turned on, a voltage of the gate of the high side normally-on switch HS may be decreased to a voltage (for example, 0 V) higher than that of the first low level driving power supply −VSSH1.

Then, the second switching device SW2 may be turned off, and the first switching device SW1 may be turned on. As the first switching device SW1 connected to the first low level driving power supply −VSSH1 is turned on, a voltage of the gate of the high side normally-on switch HS may be decreased to a negative voltage (for example, −15 V) corresponding to a voltage of the first low level driving power supply −VSSH1.

As stated above, in order for a normally-on switch such as a depletion-type transistor to be fully turned off, a negative voltage has to be applied to a gate of the normally-on switch, and in particular, the stability of a high side gate driver is required since a relatively high voltage is applied to the high side gate driver. Since the negative voltage is generated based on a positive voltage applied from the outside, a variation of the negative voltage may occur. The variation of the negative voltage may deteriorate the stability of the high side gate driver.

The high side gate driver HGD and the power device including the high side gate driver HGD may further include the second switching device SW2 connected between the second low level driving power supply −VSSH2, which provides a voltage (for example, 0 V) larger than the voltage (that is, the negative voltage) of the first low level driving power supply −VSSH1, and the protection device PD. Thus, in order to turn off the high side normally-on switch HS, first the second switching device SW2 is turned on and thus a voltage of the gate of the high side normally-on switch HS may be stably decreased to an invariable voltage (for example, 0 V), and then the first switching device SW1 is turned on and thus the voltage of the gate of the high side normally-on switch HS may be decreased to the negative voltage. Thus, the stability of the high side gate driver HGD may be improved, and consequently, the performance of the power device may be improved.

Although the example embodiments of FIGS. 1 through 4 have been illustrated and described based on a half-bridge inverter, the example embodiments are not limited thereto. For example, as illustrated in FIG. 5, a high side gate driver HGD according to another example embodiment and a power device including the high side gate driver HGD may be implemented by using a full-bridge inverter.

Figure 5:
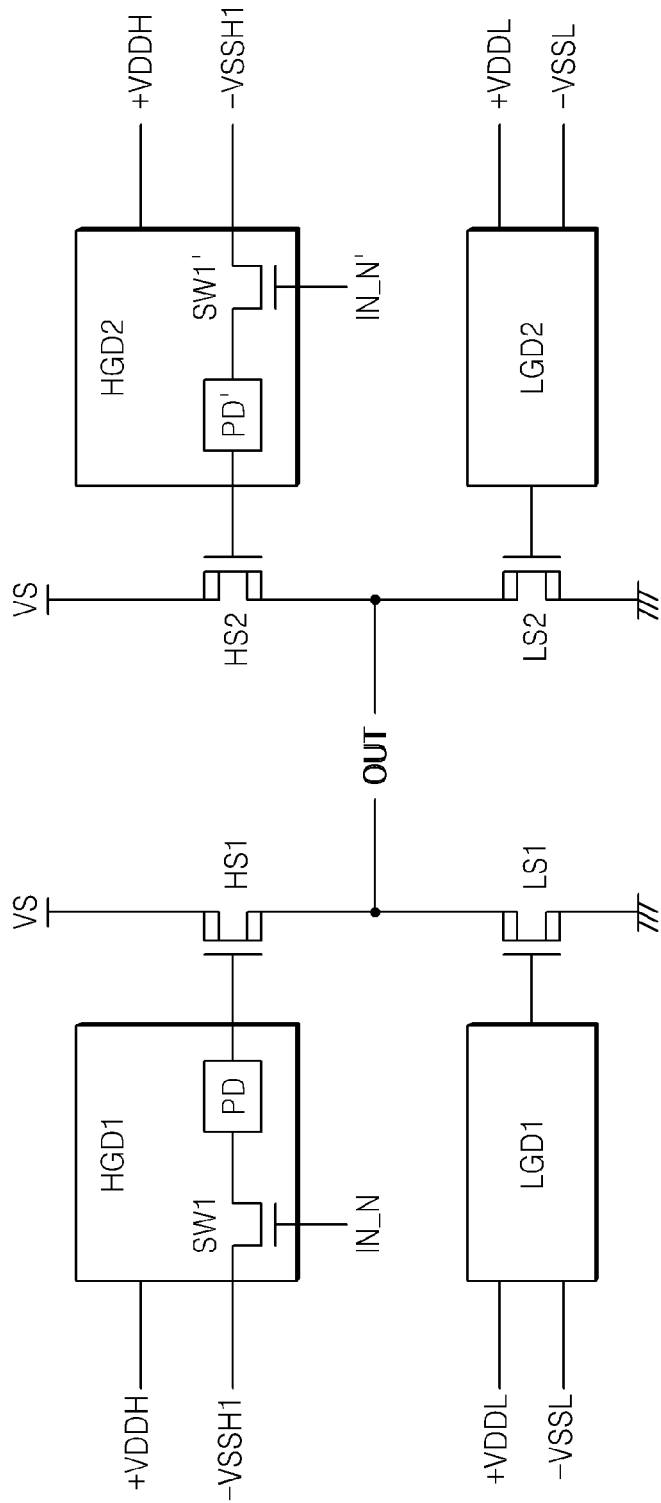
FIG. 5 is a block diagram schematically illustrating a power device according to another example embodiment.

Referring to FIG. 5, a power device implemented by using a full-bridge inverter may include a first low side normally-on switch LS1, a first low side gate driver LGD1, a first high side normally-on switch HS1, and a first high side gate driver HGD1. Description of these elements is the same as that presented with reference to FIG. 1. Furthermore, the power device may further include a second low side normally-on switch LS2, a second low side gate driver LGD2, a second high side normally-on switch HS2, and a second high side gate driver HGD2.

Although only the first high side gate driver HGD1, which includes a protection device PD and a first switching device SW1, and a second high side gate driver HGD2, which includes a protection device PD' and a first switching device SW1', are illustrated in FIG. 5, the example embodiments are not limited thereto. For example, the protection devices PD and PD' illustrated in FIG. 5, may be implemented by using an additional normally-on switch as illustrated in FIGS. 2 through 4.

Figure 6:
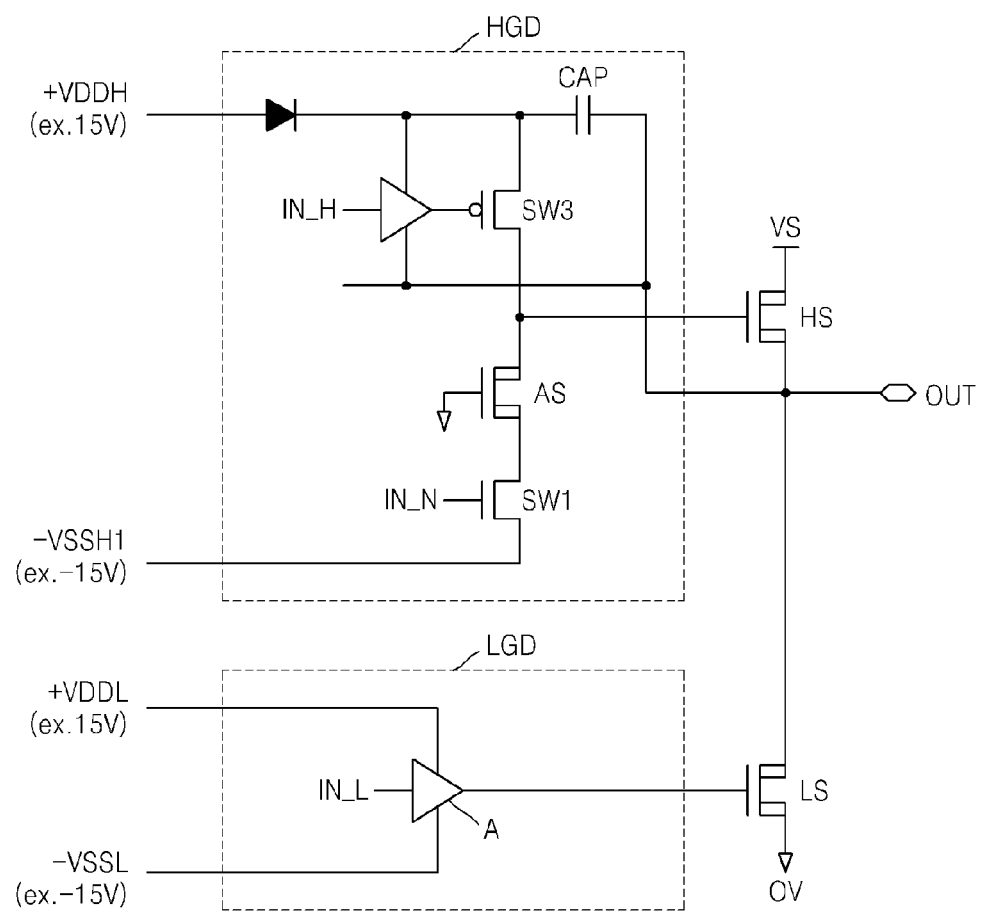
FIG. 6 is a block diagram schematically illustrating a power device according to another example embodiment.

FIG. 6 is a block diagram schematically illustrating a power device according to another example embodiment.

Referring to FIG. 6, the power device may include a low side normally-on switch LS, a low side gate driver LGD, a high side normally-on switch HS, and a high side gate driver HGD. These elements have been described with reference to FIG. 1 and FIG. 2, and thus, a repeated description will be omitted.

The low side gate driver LGD may be configured to control the low side normally-on switch LS by receiving a voltage of a high level driving power supply +VDDL and a voltage of a low level driving power supply −VSSL. In more detail, an amplifier A of the low side gate driver LGD may receive a signal IN_L and then generate a signal swinging between the voltage of the high level driving power supply +VDDL and the voltage of the low level driving power supply −VSSL, and may transmit the swinging signal to a gate of the low side normally-on switch LS.

The high side gate driver HGD may be configured to control the high side normally-on switch HS by receiving a voltage of a high level driving power supply +VDDH and a voltage of a first low level driving power supply −VSSH1. In more detail, the high side gate driver HGD may include an additional normally-on switch AS and a first switching device SW1 as described with reference to FIG. 2. In addition, the high side gate driver HGD may include a third switching device SW3 and a capacitive device CAP.

The third switching device SW3 may be connected between the high level driving power supply +VDDH and a gate of the high side normally-on switch HS. In more detail, the third switching device SW3 may be provided to turn on the high side normally-on switch HS. As the third switching device SW3 is turned on, the voltage (for example, 15 V) of the high level driving power supply +VDDH may be transmitted to the gate of the high side normally-on switch HS. Thus, the high side normally-on switch HS may be turned on.

The capacitive device CAP may be connected between the high level driving power supply +VDDH and a source of the high side normally-on switch HS. In more detail, the capacitive device CAP may be provided to more completely turn on the high side normally-on switch HS. The capacitive device CAP may store a relatively high voltage (for example, 400 V), and thus, a voltage obtained by adding the relatively high voltage (for example, 400 V) and the voltage (for example, 15 V) of the high level driving power supply +VDDH may be transmitted to the gate of the high side normally-on switch HS as the third switching device SW3 is turned on. Thus, a stable turn-on state of the high side normally-on switch HS may be maintained although a voltage of an output terminal OUT increases.

Figure 7:
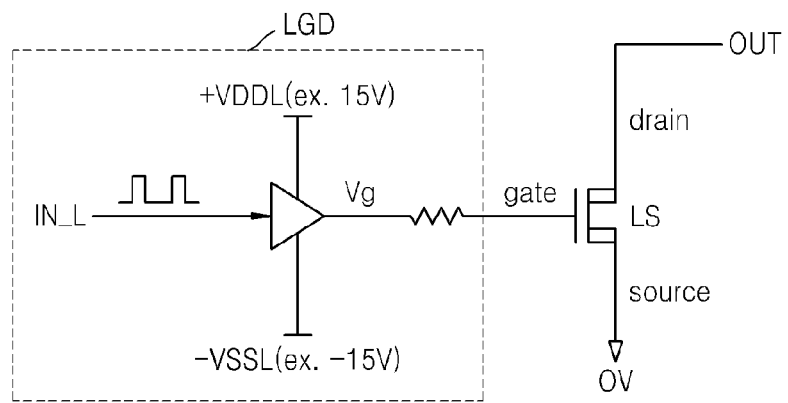
FIG. 7 is a circuit diagram illustrating a low side normally-on switch and a low side gate driver, which are elements of the power device of FIG. 6.
Figure 8:
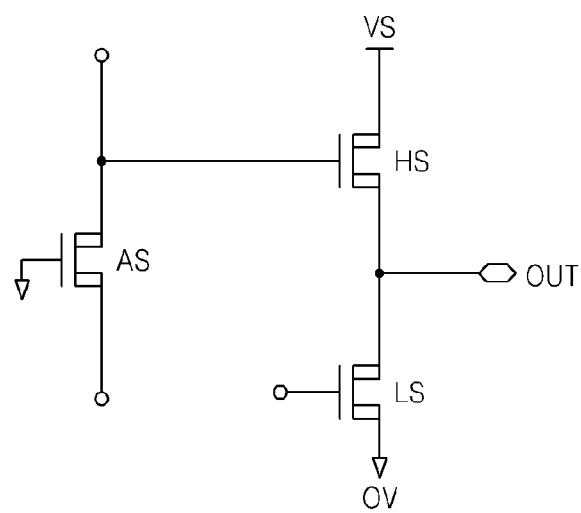
FIG. 8 is a circuit diagram illustrating a low side normally-on switch, a high side normally-on switch, and an additional normally-on switch, which are elements of the power device of FIG. 6.

FIG. 7 is a circuit diagram illustrating the low side normally-on switch LS and the low side gate driver LGD, which are elements of the power device of FIG. 6. FIG. 8 is a circuit diagram illustrating the low side normally-on switch LS, the high side normally-on switch HS, and the additional normally-on switch AS, which are elements of the power device of FIG. 6.

Referring to FIG. 7, since the source of the low side normally-on switch LS is connected to a low power supply (for example, the ground), the low side normally-on switch LS may be turned on or off although a relatively high level voltage is not applied to the gate of the low side normally-on switch LS. Thus, the low side gate driver LGD for controlling the low side normally-on switch LS may be implemented by using a DC-DC converter, and the swing amplitude of the DC-DC converter does not need to be increased to a relatively high level voltage corresponding to a voltage of the output terminal OUT. Thus, since a voltage (for example, 15 V) of the high level driving power supply +VDDL of the low side gate driver LGD and a voltage (for example, −15 V) of the low level driving power supply −VSSL, which are relatively low, are used, breakdown of surrounding switching devices does not occur.

However, in the case of the high side gate driver HGD, a relatively high level voltage is applied to the output terminal OUT as stated above. Thus, a relatively high level voltage corresponding to a voltage of the output terminal OUT has to be applied to the gate of the high side normally-on switch HS to turn on or off it. The relatively high level voltage may cause breakdown of surrounding switching devices.

Referring to the example embodiment illustrated in FIG. 8, as stated above, the high side gate driver HGD and the power device including the high side gate driver HGD include the additional normally-on switch AS connected to the gate of the high side normally-on switch HS. A resistance value of the high side normally-on switch HS may be about 50 times through about 100 times larger than those of the surrounding switching devices SW1 and SW3. Thus, the relatively high level voltage applied to the gate of the high side normally-on switch HS may be applied mostly to the additional normally-on switch AS, and thus, preventing a breakdown that may occur if a relatively high level voltage is applied to the surrounding switching devices SW1 and SW3.

In addition, in the example embodiment of the high side gate driver HGD and the power device including the high side gate driver HGD, the additional normally-on switch AS implemented by using the same structure as the high side normally-on switch HS is formed as a protection device. Thus, the high side normally-on switch HS, the low side normally-on switch LS, and the additional normally-on switch AS may be implemented by performing the same process, and the protection device may be implemented without an additional process. Furthermore, since only a small area (for example, one-tenth through one hundredth of a plane area of the high side normally-on switch HS) is necessary to implement the additional normally-on switch AS, a large increase of an area of a switching chip is not required. An example in which the high side normally-on switch HS, the low side normally-on switch LS, and the additional normally-on switch AS are implemented in a single switching chip by using the same process will be described below with reference to FIG. 13.

Figure 9:
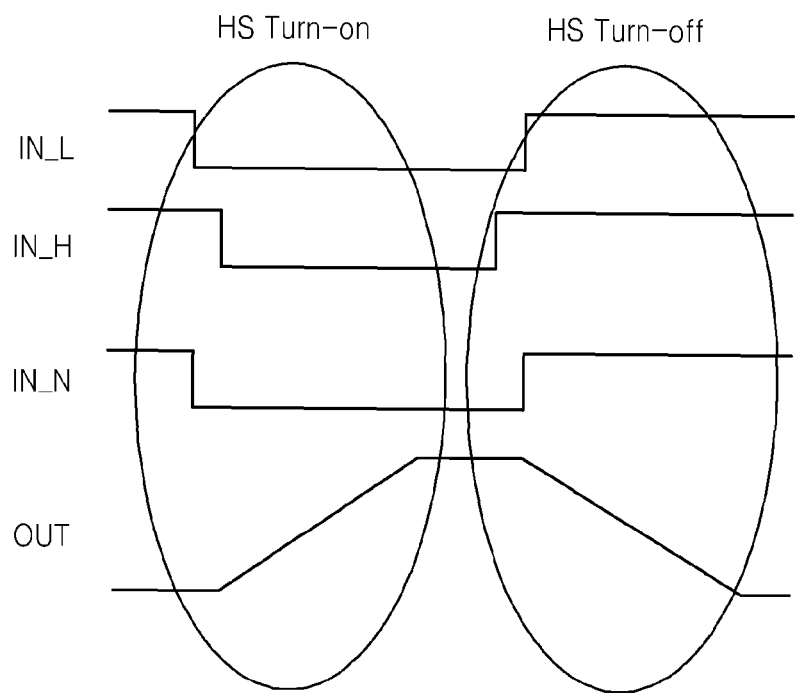
FIG. 9 is a timing diagram illustrating an operation of the power device of FIG. 6.

FIG. 9 is a timing diagram illustrating an operation of the power device of FIG. 6.

Referring to FIGS. 6 and 9, an operation of turning off the low side normally-on switch LS and turning on the high side normally-on switch HS is performed to supply the power supply voltage VS to the output terminal OUT.

The level of the signal IN_L is changed from a high level state to a low level state. Thus, the low side normally-on switch LS is turned off. Then, the level of a signal IN_H is changed from a high level state to a low level state, and thus, the third switching device SW3 is turned on. As the third switching device SW3 is turned on, the voltage (for example, 15 V) of the high level driving power supply +VDDH may be transmitted to the gate of the high side normally-on switch HS. Thus, the high side normally-on switch HS may be turned on, and thus, the voltage of the output terminal OUT may increase. The capacitive device CAP may store a relatively high voltage (for example, 400 V), and as stated above, a voltage obtained by adding the relatively high voltage (for example, 400 V) and the voltage (for example, 15 V) of the high level driving power supply +VDDH may be transmitted to the gate of the high side normally-on switch HS as the third switching device SW3 is turned on.

Then, an operation of turning on the low side normally-on switch LS and turning off the high side normally-on switch HS is performed.

First, the level of the signal IN_H is changed from the low level state to the high level state. Thus, the third switching device SW3 is turned off, and the voltage of the high level driving power supply +VDDH is not transmitted to the gate of the high side normally-on switch HS. Then, the level of the signal IN_N is changed from the low level state to the high level state. Thus, the first switching device SW1 is turned on, and the relatively high level voltage (that is, charges) stored in the gate of the high side normally-on switch HS may be discharged through the first low level driving power supply −VSSH1. The high side normally-on switch HS may be fully turned off when the discharge is completed. As stated above, the additional normally-on switch AS may prevent a breakdown of the first switching device SW1 during the discharge. In order to turn on the low side normally-on switch LS, the level of the signal IN_L is changed from the low level state to the high level state. As the low side normally-on switch LS is turned on, the voltage of the output terminal OUT may be decreased.

Figure 10:
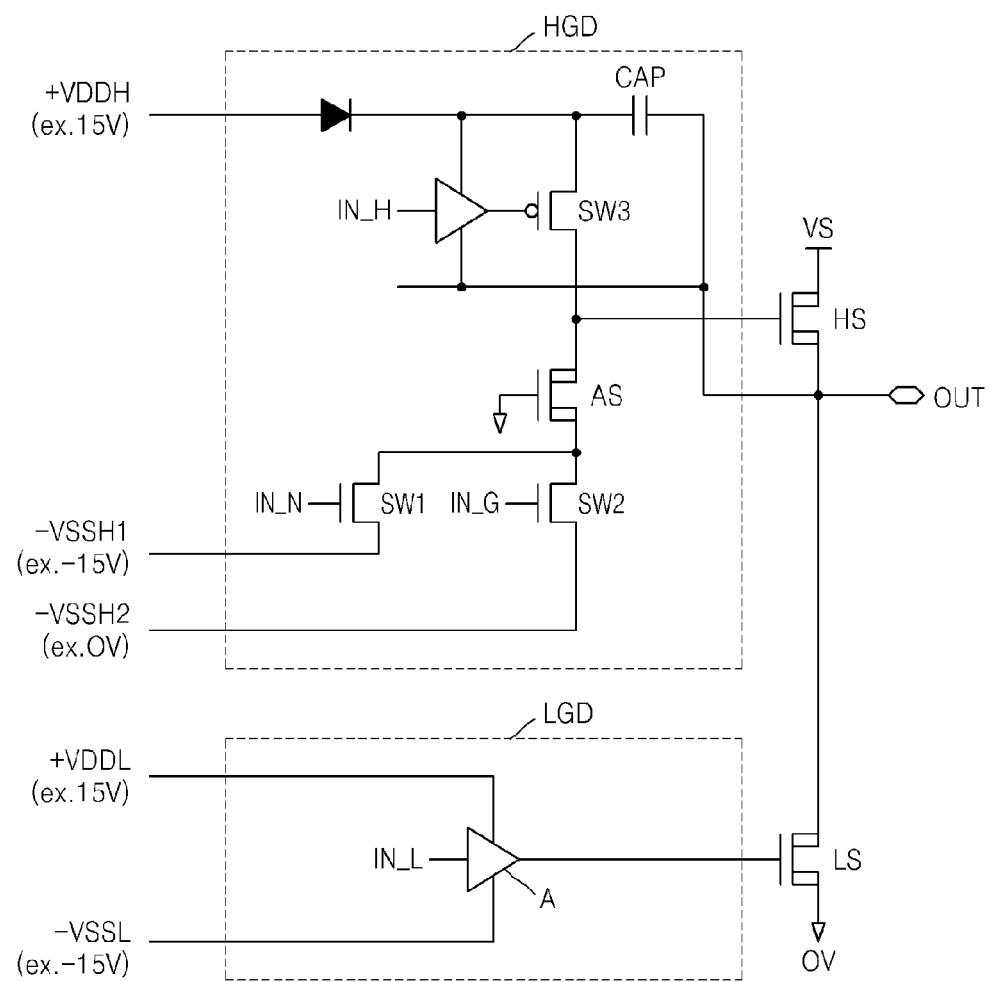
FIG. 10 is a block diagram schematically illustrating a power device according to another example embodiment.

FIG. 10 is a block diagram schematically illustrating a power device according to another example embodiment The power device of FIG. 10 shows a configuration in which a second switching device SW2 is included in the power device of FIG. 6. As described with reference to FIG. 4, the second switching device SW2 may be connected between a second low level driving power supply –VSSH2 and an additional normally-on switch AS. The second switching device SW2 may be turned on by receiving a signal IN_G, and thus, a voltage (for example, 0 V) of the second low level driving power supply –VSSH2 may be applied to a gate of a high side normally-on switch HS.

Figure 11:
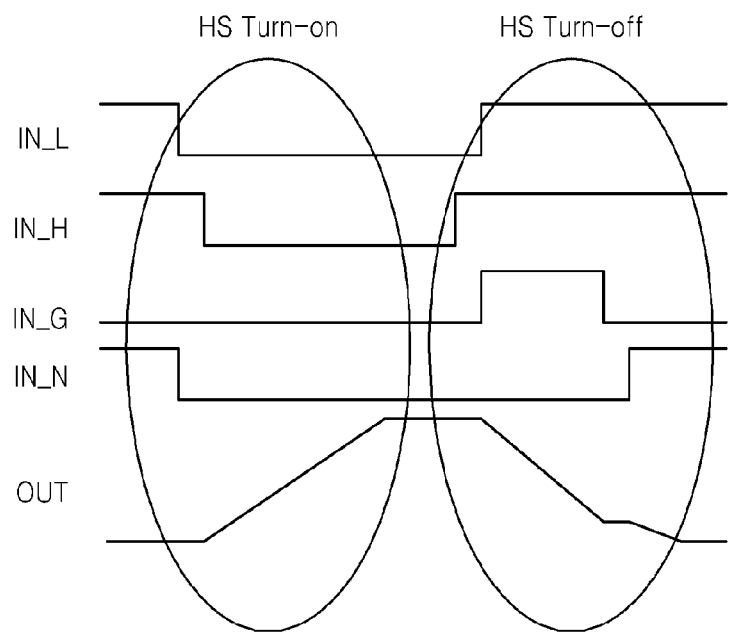
FIG. 11 is a timing diagram illustrating an operation of the power device of FIG. 10.

FIG. 11 is a timing diagram illustrating an operation of the power device of FIG. 10.

Referring to FIGS. 10 and 11, an operation of turning off the low side normally-on switch LS and turning on the high side normally-on switch HS is performed to supply the power supply voltage VS to the output terminal OUT. Since the turning off the low side normally-on switch LS and turning on the high side normally-on switch HS operations are the same as that described with reference to FIG. 9, repeated descriptions will be omitted below.

Next, an operation of turning on the low side normally-on switch LS and turning off the high side normally-on switch HS is performed.

First, the level of a signal IN_H is changed from a low level state to a high level state. Thus, the third switching device SW3 is turned off, and the voltage of the high level driving power supply +VDDH is not transmitted to the gate of the high side normally-on switch HS. In order to turn on the low side normally-on switch LS, the level of a signal IN_L is changed from a low level state to a high level state. As the low side normally-on switch LS is turned on, the voltage of the output terminal OUT may be decreased.

Then, the level of the signal IN_G is changed from a low level state to a high level state. Thus, the second switching device SW2 is turned on, and a relatively high level voltage (that is, charges) stored in the gate of the high side normally-on switch HS may be discharged through the second low level driving power supply –VSSH2. After the discharge, the level of the signal IN_G is changed from the high level state to the low level state, and the level of the signal IN_N is changed from the low level state to the high level state. Thus, the first switching device SW1 is turned on, and the relatively high level voltage (that is, charges) stored in the gate of the high side normally-on switch HS may be completely discharged through the first low level driving power supply –VSSH1.

In order to turn off the high side normally-on switch HS, first, the second switching device SW2 is turned on, and then the first switching device SW1 is turned on. As stated above, in order for the high side normally-on switch HS to be fully turned off, a negative voltage has to be applied to the gate of the high side normally-on switch HS. Since the negative voltage is generated based on a positive voltage applied from the outside, a variation of the negative voltage may occur, and the variation of the negative voltage may deteriorate the stability of the high side gate driver HGD.

In the high side gate driver HGD depending on the timing operation of FIG. 11 and the power device including the high side gate driver HGD, in order to turn off the high side normally-on switch HS, first the second switching device SW2 is turned on and thus a voltage of the gate of the high side normally-on switch HS may be stably decreased to an invariable voltage (for example, 0 V), and then the first switching device SW1 is turned on and thus the voltage of the gate of the high side normally-on switch HS may be decreased to the negative voltage. Thus, the stability of the high side gate driver HGD may be improved, and consequently the performance of the power device may be improved.

Figure 12:
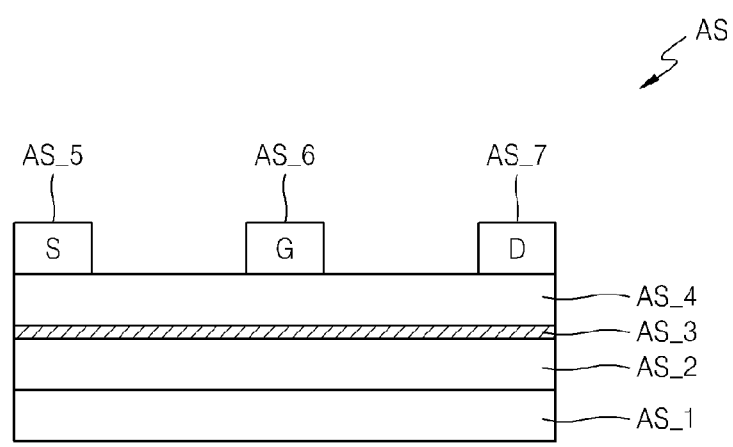
FIG. 12 is a process cross-sectional view illustrating an implementation example of an additional normally-on switch according to an example embodiment.

FIG. 12 is a process cross-sectional view illustrating an implementation example of an additional normally-on switch AS according to an example embodiment.

Referring to FIG. 12, the additional normally-on switch AS that is an example of a protection device may include a semiconductor substrate AS_1, a lower semiconductor layer AS_2, a channel layer AS_3, an upper semiconductor layer AS_4, which are sequentially stacked on the semiconductor substrate AS_1, and one or more electrodes that are formed on the upper semiconductor layer AS_4. The one or more electrodes may include a source electrode AS_5, a gate electrode AS_6, and a drain electrode AS_7.

The source electrode AS_5, the gate electrode AS_6, and the drain electrode AS_7 are formed spaced apart from each other on the upper semiconductor layer AS_4, and may include conductive materials. In addition, the lower semiconductor layer AS_2 and the upper semiconductor layer AS_4 may include different materials having different band gaps. For example, the lower semiconductor layer AS_2 may include GaN, GaAs, InN, or the like, and the upper semiconductor layer AS_4 may include AlGaN, AlGaAs, AlInN, or the like. According to a bandgap difference between the lower semiconductor layer AS_2 and the upper semiconductor layer AS_4, a two dimensional electron gas (2DEG) layer may be induced at the interface between the lower semiconductor layer AS_2 and the upper semiconductor layer AS_4, and an induced 2DEG layer may operate as the channel layer AS_3.

As stated above, the additional normally-on switch AS that is an example of the protection device may be implemented by using the same structure as the high side normally-on switch HS and/or the low side normally-on switch LS. Thus, the high side normally-on switch HS and/or the low side normally-on switch LS also may include a lower semiconductor layer, a channel layer, and an upper semiconductor layer like the additional normally-on switch AS.

Figure 13:
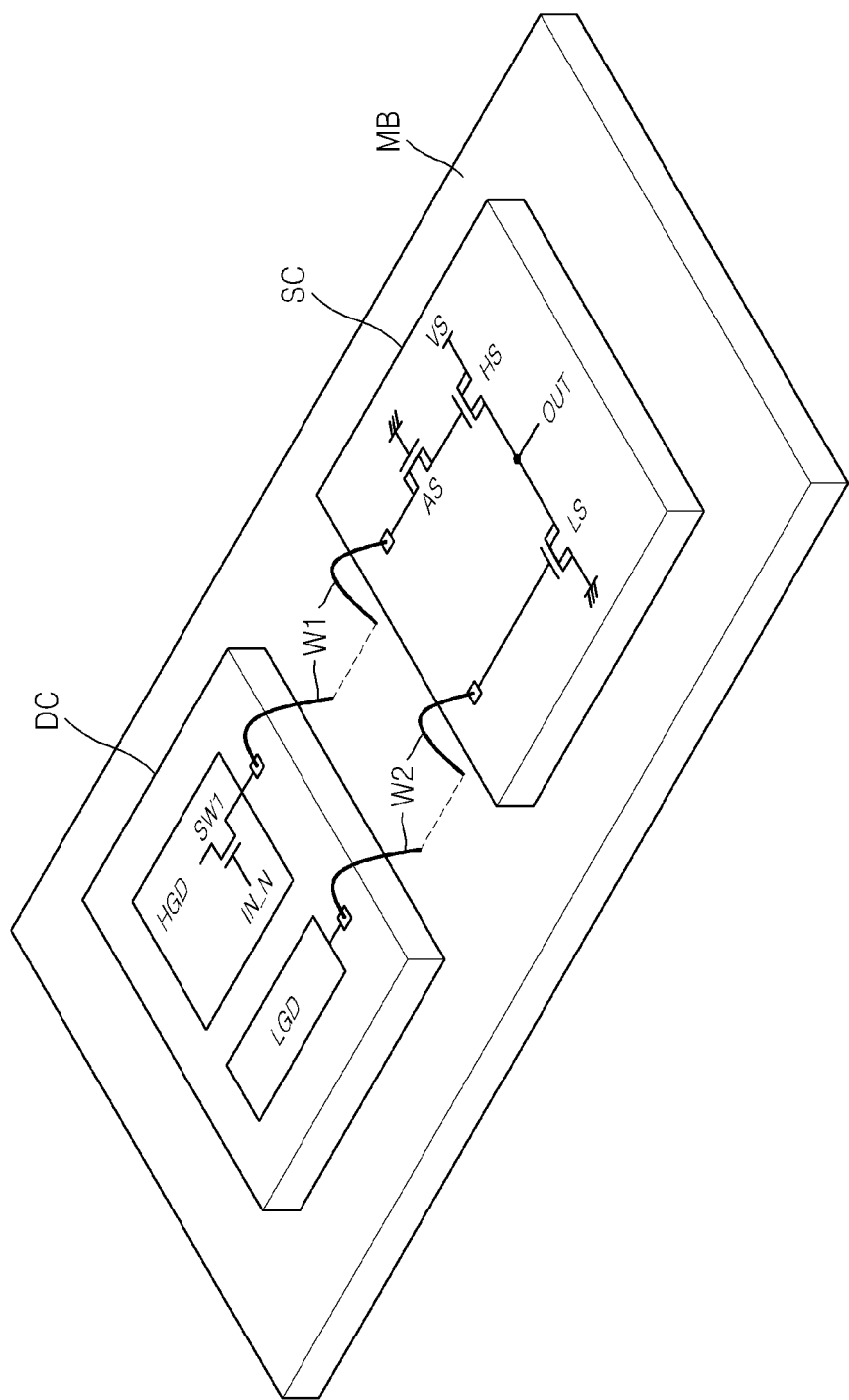
FIG. 13 is a block diagram schematically illustrating a power device including a switching chip according to an example embodiment.

FIG. 13 is a block diagram schematically illustrating a power device including a switching chip SC according to an example embodiment. The power device of FIG. 13 may be an example of an implementation of the power device according to the embodiment of FIG. 2. Thus, a repeated description of the description of FIG. 2 is omitted.

Referring to FIG. 13, a high side normally-on switch HS, a low side normally-on switch LS, and an additional normally-on switch AS may be implemented in a single switching chip SC by using the same process. Thus, the switching chip SC may include the high side normally-on switch HS, the low side normally-on switch LS, and the additional normally-on switch AS, which have the same structure. A method of manufacturing the switching chip SC by using the same process will be described below with reference to FIG. 14.

Among the elements of the power device illustrated in FIG. 2, the remaining elements (for example, the high side gate driver HGD, which includes the first switching device SW1, and the side gate driver LGD) except the elements (for example, the high side normally-on switch HS, the low side normally-on switch LS, and the additional normally-on switch AS) implemented in the switching chip SC may be implemented in a driver chip DC.

The switching chip SC and the driver chip DC may be mounted on a module board MB, and may be connected to each other through wiring elements such as wires W1 and W2. For example, the first switching device SW1 and the additional normally-on switch AS may be electrically connected to each other through the wire W1, and the low side gate driver LGD and the low side normally-on switch LS may be connected to each other through the wire W2.

Figure 14:
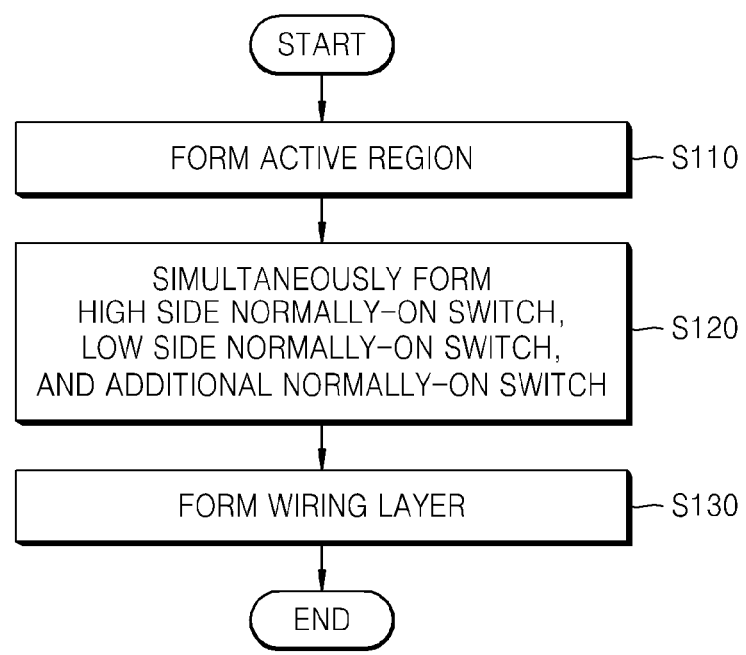
FIG. 14 is a flowchart schematically illustrating a method of manufacturing a switching chip, according to an example embodiment.

FIG. 14 is a flowchart schematically illustrating a method of manufacturing a switching chip, according to an example embodiment. The method of FIG. 14 may be an example of a method of manufacturing the switching chip SC of FIG. 13.

Referring to FIGS. 13 and 14, an active region is formed to form a high side normally-on switch HS, a low side normally-on switch LS, and an additional normally-on switch AS (operation S110). Next, the high side normally-on switch HS, the low side normally-on switch LS, and the additional normally-on switch AS are simultaneously formed (or formed in parallel) (operation S120). As a process for simultaneously forming the high side normally-on switch HS, the low side normally-on switch LS, and the additional normally-on switch AS is performed, the additional normally-on switch AS having the structure shown in FIG. 12 and the high side normally-on switch HS and low side normally-on switch LS, which have the same structure as that of additional normally-on switch AS, may be implemented. Next, a wiring layer is formed (operation S130).

A switching chip according to an example embodiment includes an additional normally-on switch that is simultaneously (or alternatively, in parallel) formed while forming a high side normally-on switch and/or a low side normally-on switch. Thus, a protection device may be implemented without adding an additional process. In addition, the additional normally-on switch may have a small area compared to the high side normally-on switch and/or the low side normally-on switch. Thus, the protection device may be implemented without occupying a large area of the switching chip.

It should be understood that the shape of respective parts in the drawings attached to clearly understand the present inventive concept is only illustrative, and may be variously modified. Also, like reference numerals in the drawings denote like elements.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A high side gate driver configured to control a high side normally-on switch, the high side gate driver comprising:
    a first switching device configured to receive a first low level driving power supply; and
    a protection device connected in series between the first switching device and a gate of the high side normally-on switch, the protection device configured to reduce a voltage that is applied to the first switching device, wherein
    the protection device includes an additional normally-on switch,
    the additional normally-on switch has a negative threshold voltage, and a gate of the additional normally-on switch is connected to a ground terminal,
    a first voltage and a second voltage larger than the first voltage are transmitted to the gate of the high-side normally-on switch such that charges are stored in the gate, and
    the charges are discharged when the first switching device is turned on, and the additional normally-on switch prevents a breakdown of the first switching device during the discharge.

2. The high side gate driver of claim 1, wherein a resistance value of the protection device is 50 times through 100 times a resistance value of the first switching device.

3. The high side gate driver of claim 1, wherein a plane area of the additional normally-on switch is one-tenth to one hundredth of the plane area of the high side normally-on switch.

4. The high side gate driver of claim 1, further comprising:
    an additional switching device connected between a high level driving power supply and the gate of the high side normally-on switch, the additional switching device configured to selectively provide a first high level driving signal to the high side normally-on switch to turn on the high side normally-on switch.

5. The high side gate driver of claim 1, wherein the additional normally-on switch and the high side normally-on switch have a same structure.

6. The high side gate driver of claim 5, wherein the same structure is one of a gallium nitride (GaN) transistor, a silicon carbide (SiC) transistor, and an insulated gate bipolar transistor.

7. The high side gate driver of claim 1, further comprising:
    a second switching device connected between the protection device and a second low level driving power supply, wherein a voltage of the second low level driving power supply is larger than a voltage of the first low level driving power supply.

8. The high side gate driver of claim 7, wherein, the first switching device is configured to turn on after the second switching device is turned on, if the high side normally-on switch is turned off.

9. The high side gate driver of claim 1, wherein the gate of the additional normally-on switch is directly connected to a ground terminal.

10. A high side gate driver configured to control a high side normally-on switch, the high side gate driver comprising:
    a first switching device configured to receive a first low level driving power supply; and
    a protection device connected in series between the first switching device and a gate of the high side normally-on switch, the protection device configured to reduce a voltage that is applied to the first switching device, wherein
    the protection device includes an additional normally-on switch,
    a source or a drain of the additional normally-on switch is connected to a gate of the additional normally-on switch,
    the source or the drain of the additional normally-on switch is connected to the gate of the additional normally-on switch such that the additional normally-on switch functions as a diode device having a high resistance value,
    a first voltage and a second voltage larger than the first voltage are transmitted to the gate of the high-side normally-on switch such that charges are stored in the gate, and
    the charges are discharged when the first switching device is turned on, and the additional normally-on switch prevents a breakdown of the first switching device during the discharge.

11. The high side gate driver of claim 10, wherein the source or the drain of the additional normally-on switch is directly connected to the gate of the additional normally-on switch.

12. A power device comprising:
a high side normally-on switch having a source connected to an output terminal, a drain connected to a high level power supply, and a gate, the high side normally-on switch configured to turn off in response to a first low level driving signal; and
a high side gate driver configured to control the high side normally-on switch, the high side gate driver including,
a first switching device having a first terminal and a second terminal, the first switching device being configured to transfer a first low level driving power supply from the first terminal to the second terminal, and
a protection device connected in series between the second terminal of the first switching device and the gate of the high side normally-on switch, the protection device configured to reduce a voltage that is applied to the first switching device, wherein the high side gate driver further includes,
an additional switching device connected between a high level driving power supply and the gate of the high side normally-on switch, the additional switching device configured to selectively provide a first high level driving signal to the high side normally-on switch to turn on the high side normally-on switch.

13. The power device of claim 12, wherein the high side gate driver further comprises:
a capacitive device connected between the high level driving power supply and the source of the high side normally-on switch.

14. The power device of claim 12, further comprising:
a low side normally-on switch, the low side normally-on switch having a source connected to a low level power supply, a drain connected to the output terminal, and a gate; and
a low side gate driver configured to control the low side normally-on switch.

15. A power device comprising:
a high side normally-on switch having a source connected to an output terminal, a drain connected to a high level power supply, and a gate configured to switch on the high side normally-on switch in response to a signal provided by a high level driving power supply and switch off the high side normally-on switch in response to a signal provided by a first low level driving power supply;
a first switching device configured to receive the first low level driving power supply;
an additional normally-on switch connected between the first switching device and the gate of the high side normally-on switch, the additional normally-on switch configured to reduce a voltage that is applied to the first switching device;
a second switching device connected between a second low level driving power supply and the additional normally-on switch; and
a third switching device connected between the high level driving power supply and the gate of the high side normally-on switch, wherein
the third switching device is configured to transmit a first voltage of the high level driving power supply and a second voltage larger than the first voltage to the gate of the high side normally-on switch,
charges are stored in the gate when the third switching device is turned on, and
the charges are discharged when the first switching device is turned on, and the additional normally-on switch prevents a breakdown of the first switching device during the discharge.

16. The power device of claim 15,
wherein a voltage of the second low level driving power supply is larger than a voltage of the first low level driving power supply.

17. A switching chip comprising:
a high side normally-on switch having a source connected to an output terminal, a drain connected to a high level power supply, and a gate;
an additional normally-on switch connected to the gate of the high side normally-on switch; and
a low side normally-on switch having a source connected to a low level power supply, a drain connected to the output terminal, and a gate, wherein
the high side normally-on switch, the additional normally-on switch, and the low side normally-on switch have a same structure, and
the additional normally-on switch has a gate configured to receive a voltage applied thereto that is larger than a threshold voltage of the additional normally-on switch such that the additional normally-on switch is configured to be normally on during operation of the switching chip, wherein
a first voltage and a second voltage larger than the first voltage are transmitted to the gate of the high-side normally-on switch such that charges are stored in the gate, and
the charges are discharged when the first switching device is turned on, and the additional normally-on switch prevents a breakdown of the first switching device during the discharge.

18. The switching chip of claim 17, wherein a plane area of the additional normally-on switch is one-tenth to one hundredth of the plane area of the high side normally-on switch.

19. The switching chip of claim 17, wherein the additional normally-on switch has a negative threshold voltage, and the gate of the additional normally-on switch is connected to a ground terminal.

20. The switching chip of claim 17, wherein a source or a drain of the additional normally-on switch is connected to the gate of the additional normally-on switch such that the additional normally-on switch functions as a diode device having a high resistance value.

* * * * *